US008723163B2

(12) United States Patent
Uetani

(10) Patent No.: US 8,723,163 B2
(45) Date of Patent: May 13, 2014

(54) ORGANIC PHOTOELECTRIC CONVERTER

(75) Inventor: Yasunori Uetani, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 672 days.

(21) Appl. No.: 12/922,107

(22) PCT Filed: Mar. 5, 2009

(86) PCT No.: PCT/JP2009/054704
§ 371 (c)(1),
(2), (4) Date: Sep. 10, 2010

(87) PCT Pub. No.: WO2009/113599
PCT Pub. Date: Sep. 17, 2009

(65) Prior Publication Data
US 2011/0017300 A1    Jan. 27, 2011

(30) Foreign Application Priority Data

Mar. 12, 2008    (JP) .................................. 2008-062265

(51) Int. Cl.
*H01L 51/54* (2006.01)
*C07D 333/02* (2006.01)

(52) U.S. Cl.
USPC .................. 257/40; 428/690; 549/29; 549/59

(58) Field of Classification Search
USPC .......................... 428/690; 257/40; 549/29, 59
See application file for complete search history.

(56) References Cited

U.S. PATENT DOCUMENTS

| | | | |
|---|---|---|---|
| 8,298,686 B2 * | 10/2012 | Uetani | 428/690 |
| 8,440,109 B2 * | 5/2013 | Itoh et al. | 252/511 |
| 2005/0022865 A1 | 2/2005 | Robeson et al. | |
| 2006/0009614 A1 | 1/2006 | Yamahara et al. | |
| 2006/0102890 A1 | 5/2006 | Yamahara et al. | |
| 2007/0045592 A1 | 3/2007 | Tierney et al. | |
| 2007/0144579 A1 | 6/2007 | Jung et al. | |
| 2007/0195576 A1 | 8/2007 | Imada et al. | |
| 2008/0003422 A1 | 1/2008 | Ueda | |

FOREIGN PATENT DOCUMENTS

| | | |
|---|---|---|
| JP | 2001-151870 A | 6/2001 |
| JP | 2004-107625 A | 4/2004 |
| JP | 2005-259436 A | 9/2005 |
| JP | 2006-019357 A | 1/2006 |
| JP | 2006-063334 A | 3/2006 |
| JP | 2007-051289 A | 3/2007 |
| WO | 2005/117157 A1 | 12/2005 |
| WO | 2008/104301 A2 | 9/2008 |
| WO | 2009/058811 A1 | 5/2009 |

OTHER PUBLICATIONS

European Search Report dated May 16, 2012 issued in European Patent Application No. 09720999.3.
Takahashi, K et al., "Enhanced Photocurrent by Schottky-Barrier Solar Cell Composed of Regioregular Polythiophene with Merocyanine Dye", Synthetic Metals, Elsevier Sequoia, Lausanne, CH, vol. 130, No. 2, Sep. 20, 2002, pp. 177-183, XP008063681.
Kyung Hwan Kim et al., "Soluble Star-Shaped Molecules Based on Thiophene Derivatives as Organic Semiconductors for Field-Effect Transistor Applications", Chemistry of Materials, vol. 19, No. 20. Oct. 1, 2007, pp. 4925-4932, XP55026660.
Peet, J et al., "Efficiency Enhancement in Lo-Bandgap Polymer Solar Cells by Processing with Alkane Dithiols", Nature Materials, Nature Publishing Group, London, GB, vol. 6, May 27, 2007, pp. 497-500, XP002515637.
First Office Action issued Feb. 13, 2012 in Chinese Patent Application No. 200980108409.2 with partial English translation.
Second Office Action issued Jun. 19, 2012 in Chinese Patent Application No. 200980108409.2 with partial English translation.
Notice of Reason for Rejection issued May 14, 2013 in Japanese Patent Application No. 2009-056103 with English translation.
Machine-generated English translation of JP 2006-063334 published Mar. 9, 2006 to Sumitomo Chemical Co., Ltd.
J. Peet et al., "Efficiency enhancement in low-bandgap polymer solar cells by processing with alkane dithiols," Nature Materials, vol. 6, Jul. 2007, pp. 487-500.
J. Peet et al., "Method for increasing the photoconductive response in conjugated polymer/fullerene composites," Applied Physics Letters, vol. 89, 2006, pp. 252105-1-252105-3.

* cited by examiner

*Primary Examiner* — Golam M M Shameem
(74) *Attorney, Agent, or Firm* — Sughrue Mion, PLLC

(57) ABSTRACT

Disclosed is an organic photoelectric conversion device including a pair of electrodes, at least one of which is transparent or semi-transparent, and an organic layer arranged between the electrodes and containing a conjugated polymer compound and a sulfur-containing heterocyclic compound, wherein the sulfur-containing heterocyclic compound has a condensed polycyclic structure or a bithiophene structure. Examples of the sulfur-containing heterocyclic compound include a compound represented by formula (1):

$$\underset{S}{\overset{(R^1)_3}{\fbox{}}} \!\!-\!\! \left( \underset{S}{\overset{(R^1)_2}{\fbox{}}} \right)_{\!m} \!\!-\!\! \underset{S}{\overset{(R^1)_3}{\fbox{}}} \qquad (1)$$

(wherein, a plurality of $R^1$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group, and a hydrogen atom or atoms contained in these groups may be substituted by a fluorine atom or atoms; and m represents an integer of 0 to 10) or the like.

5 Claims, No Drawings

ORGANIC PHOTOELECTRIC CONVERTER

CROSS REFERENCE TO RELATED APPLICATIONS

This application is a National Stage of International Application No. PCT/JP2009/054704 filed Mar. 15, 2009 claiming priority based on Japanese Patent Application No. 2008-062265 filed Mar. 12, 2008, the contents of both of which are incorporated herein by reference in their entirety.

TECHNICAL FIELD

The present invention relates to an organic photoelectric conversion device.

BACKGROUND ART

In recent years, various studies have been vigorously made so as to apply an organic semiconductor material to an active layer for an organic photoelectric conversion device (organic solar battery, optical sensor, and the like). Among these, since it is possible to form an active layer by using a coating method at low costs when a composition containing a polymer compound is used as the organic semiconductor material, organic photoelectric conversion devices containing compositions containing various polymer compounds have been examined. For example, an organic solar battery containing poly 3-hexylthiophene serving as a conjugated polymer compound and C60PCBM serving as a fullerene derivative has been known (Advanced Functional Materials Vol. 13 (2003) 85 p).

DISCLOSURE OF THE INVENTION

However, the organic photoelectric conversion device does not necessarily provide a sufficient open-circuit voltage (Voc).

An object of the present invention is to provide an organic photoelectric conversion device that has a high open-circuit voltage.

The present invention provides an organic photoelectric conversion device including: a pair of electrodes, at least one of which is transparent or semi-transparent; and an organic layer arranged between the electrodes and containing a conjugated polymer compound and a sulfur-containing heterocyclic compound, wherein the sulfur-containing heterocyclic compound has a condensed polycyclic structure or a bithiophene structure.

MODE FOR CARRYING OUT THE INVENTION

The present invention will be described in detail below.

<Sulfur-Containing Heterocyclic Compound>

A sulfur-containing heterocyclic compound used in the present invention has a condensed polycyclic structure or a bithiophene structure.

Examples of the sulfur-containing heterocyclic compound having a bithiophene structure include a compound represented by formula (1) or a compound represented by formula (2):

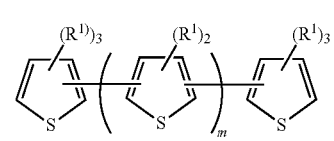

(1)

(wherein, a plurality of $R^1$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group; a hydrogen atom or atoms contained in these groups may be substituted by a fluorine atom or atoms; and m represents an integer of 0 to 10)

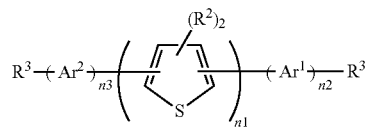

(2)

(wherein, a plurality of $R^2$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group; a hydrogen atom or atoms contained in these groups may be substituted by a fluorine atom or atoms; a plurality of $R^3$'s may be the same or different and each represents a hydrogen atom, a halogen atom, an alkyl group, an alkoxy group or an alkylthio group; a hydrogen atom or atoms contained in these groups may be substituted by a fluorine atom or atoms; $Ar^1$ and $Ar^2$ each independently represents an arylene group or a divalent heterocyclic group having a nitrogen atom; n1 represents an integer of 1 to 10, preferably 2 to 10, n2 represents an integer of 1 to 3, and n3 represents an integer of 1 to 3; when there are a plurality of $Ar^1$'s, they may be the same or different, and when there are a plurality of $Ar^2$'s, they may be the same or different.)

In formula (1), examples of a halogen atom represented by $R^1$ include a fluorine atom, a chlorine atom, a bromine atom and an iodine atom.

In formula (1), an alkyl group represented by $R^1$ may have a straight-chain structure or a branched structure, and may be a cycloalkyl group, and its number of carbon atoms is usually about 1 to 20. Examples of the alkyl group include a methyl group, an ethyl group, a n-propyl group, an i-propyl group, a n-butyl group, an i-butyl group, a t-butyl group, a s-butyl group, a 3-methylbutyl group, a n-pentyl group, a n-hexyl group, a 2-ethylhexyl group, a n-heptyl group, a n-octyl group, a n-nonyl group, a n-decyl group, a 3,7-dimethyloctyl group and a n-lauryl group. A hydrogen atom or atoms contained in the alkyl group may be substituted by a fluorine atom or atoms. Examples of the alkyl group substituted by a fluorine atom or atoms include a trifluoromethyl group, a pentafluoroethyl group, a perfluorobutyl group, a perfluorohexyl group and a perfluorooctyl group.

In formula (1), an alkoxy group represented by $R^1$ may have a straight-chain structure or a branched structure, and may be a cycloalkyloxy group, and its number of carbon atoms is usually about 1 to 20. Examples of the alkoxy group include a methoxy group, an ethoxy group, a n-propyloxy group, an i-propyloxy group, a n-butoxy group, an i-butoxy group, a s-butoxy group, a t-butoxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a n-lauryloxy group. A hydrogen atom or atoms contained in the alkoxy group may be substituted by a fluorine atom or atoms. Examples of the alkoxy group substituted by a fluorine atom include a trifluoromethoxy group, a pentafluoroethoxy group, a perfluorobutoxy group, a perfluorohexyl group and a perfluorooctyl group.

In formula (1), an alkylthio group represented by $R^1$ may have a straight-chain structure or a branched structure, and may be a cycloalkylthio group, and its number of carbon atoms is usually about 1 to 20. Examples of the alkylthio group include a methylthio group, an ethylthio group, a n-propylthio group, an isopropylthio group, a s-butylthio group, a t-butylthio group, a n-pentylthio group, a n-hexylthio group, a cyclohexylthio group, a n-heptylthio group, a n-octylthio group, a 2-ethylhexylthio group, a n-nonylthio group, a n-decylthio group, a 3,7-dimethyloctylthio group and a n-laurylthio group. A hydrogen atom or atoms contained in the alkylthio group can be substituted by a fluorine atom or atoms. Examples of the alkylthio group substituted by a fluorine atom or atoms include a trifluoromethylthio group and the like.

In formula (1), an aryl group represented by $R^1$ is an atomic group in which one hydrogen atom is removed from an aromatic hydrocarbon, and includes those having a benzene ring, those having a condensed ring and those having two or more independent benzene rings or condensed rings bonded to one another directly or through a group such as vinylene. The aryl group usually has about 6 to 60 carbon atoms, preferably 6 to 48 carbon atoms. The aryl group may have a substituent. As this substituent, a straight-chain or a branched alkyl group having 1 to 20 carbon atoms, a cycloalkyl group having 1 to 20 carbon atoms, an alkoxy group having a straight-chain or a branched alkyl group having 1 to 20 carbon atoms or a cycloalkyl group having 1 to 20 carbon atoms in its structure, or a group represented by formula (5):

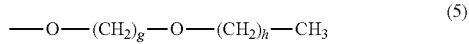

$$—O—(CH_2)_g—O—(CH_2)_h—CH_3 \quad (5)$$

(wherein, g represents an integer of 1 to 6, and h represents an integer of 0 to 5).

Examples of the aryl group include a phenyl group, a $C_1$ to $C_{12}$ alkoxyphenyl group ("$C_1$ to $C_{12}$" indicates that the number of the carbon atoms is 1 to 12, and the same is true in the following description), a $C_1$ to $C_{12}$ alkylphenyl group, a 1-naphthyl group, a 2-naphthyl group, a 1-anthracenyl group, a 2-anthracenyl group, a 9-anthracenyl group, a pentafluorophenyl group, and the like, and the $C_1$ to $C_{12}$ alkoxyphenyl group and the $C_1$ to $C_{12}$ alkylphenyl group are preferable. Examples of the $C_1$ to $C_{12}$ alkoxyphenyl group include a methoxyphenyl group, an ethoxyphenyl group, a n-propyloxyphenyl group, an isopropyloxyphenyl group, a n-butoxyphenyl group, an isobutoxyphenyl group, a s-butoxyphenyl group, a t-butoxyphenyl group, a n-pentyloxyphenyl group, a n-hexyloxyphenyl group, a cyclohexyloxyphenyl group, a n-heptyloxyphenyl group, a n-octyloxyphenyl group, a 2-ethylhexyloxyphenyl group, a n-nonyloxyphenyl group, a n-decyloxyphenyl group, a 3,7-dimethyloctyloxyphenyl group and a n-lauryloxyphenyl group. Examples of the $C_1$ to $C_{12}$ alkylphenyl group include a methyphenyl group, an ethylphenyl group, a dimethylphenyl group, a n-propylphenyl group, a mesityl group, a methylethylphenyl group, an isopropylphenyl group, a n-butylphenyl group, an isobutylphenyl group, a s-butylphenyl group, a t-butylphenyl group, a n-pentylphenyl group, an isoamylphenyl group, a hexylphenyl group, a n-heptylphenyl group, a n-octylphenyl group, a n-nonylphenyl group, a n-decylphenyl group and a n-dodecylphenyl group. A hydrogen atom or atoms contained in the aryl group may be substituted by a fluorine atom or atoms.

In formula (1), an aryloxy group represented by $R^1$ usually has about 6 to 60 carbon atoms, preferably 6 to 48 carbon atoms, and examples of the aryloxy group include a phenoxy group, a $C_1$ to $C_{12}$ alkoxyphenoxy group, a $C_1$ to $C_{12}$ alkylphenoxy group, a 1-naphthyloxy group, a 2-naphthyloxy group and a pentafluorophenyloxy group, and the $C_1$ to $C_{12}$ alkoxyphenoxy group and the $C_1$ to $C_{12}$ alkylphenoxy group are preferable.

Examples of the $C_1$ to $C_{12}$ alkoxyphenoxy group include a methoxyphenoxy group, an ethoxyphenoxy group, a n-propyloxyphenoxy group, an isopropyloxyphenoxy group, a n-butoxyphenoxy group, an isobutoxyphenoxy group, a s-butoxyphenoxy group, a t-butoxyphenoxy group, a n-pentyloxyphenoxy group, a n-hexyloxyphenoxy group, a cyclohexyloxyphenoxy group, a n-heptyloxyphenoxy group, a n-octyloxyphenoxy group, a 2-ethylhexyloxyphenoxy group, a n-nonyloxyphenoxy group, a n-decyloxyphenoxy group, a 3,7-dimethyloctyloxyphenoxy group, a n-lauryloxyphenoxy group, and the like. Specific examples of the $C_1$ to $C_{12}$ alkylphenoxy group include a methylphenoxy group, an ethylphenoxy group, a dimethylphenoxy group, a n-propylphenoxy group, a 1,3,5-trimethylphenoxy group, a methylethylphenoxy group, an isopropylphenoxy group, a n-butylphenoxy group, an isobutylphenoxy group, a s-butylphenoxy group, a t-butylphenoxy group, a n-pentylphenoxy group, an isoamylphenoxy group, a n-hexylphenoxy group, a n-heptylphenoxy group, a n-octylphenoxy group, a n-nonylphenoxy group, a n-decylphenoxy group and a n-dodecylphenoxy group.

In formula (1), an arylthio group represented by $R^1$ may have a substituent on the aromatic ring, and usually has about 6 to 60 carbon atoms, and examples of the arylthio group include a phenylthio group, a $C_1$ to $C_{12}$ alkoxyphenylthio group, a $C_1$ to $C_{12}$ alkylphenylthio group, a 1-naphthylthio group, a 2-naphthylthio group, a pentafluorophenylthio group, a pyridylthio group, a pyridazinylthio group, a pyrimidylthio group, a pyrazylthio group and a triazylthio group.

In formula (1), an arylalkyl group represented by $R^1$ may have a substituent, and usually has about 7 to 60 carbon atoms. Examples of the arylalkyl group include a phenyl-$C_1$ to $C_{12}$ alkyl group, a $C_1$ to $C_{12}$ alkoxyphenyl-$C_1$ to $C_{12}$ alkyl group, a $C_1$ to $C_{12}$ alkylphenyl-$C_1$ to $C_{12}$ alkyl group, a 1-naphthyl-$C_1$ to $C_{12}$ alkyl group and a 2-naphthyl-$C_1$ to $C_{12}$ alkyl group.

In formula (1), an arylalkoxy group represented by $R^1$ may have a substituent, and usually has about 7 to 60 carbon atoms. Examples of the arylalkoxy group include a phenyl-$C_1$ to $C_{12}$ alkoxy group, a $C_1$ to $C_{12}$ alkoxyphenyl-$C_1$ to $C_{12}$ alkoxy group, a $C_1$ to $C_{12}$ alkylphenyl-$C_1$ to $C_{12}$ alkoxy group, a 1-naphthyl-$C_1$ to $C_{12}$ alkoxy group and a 2-naphthyl-$C_1$ to $C_{12}$ alkoxy group.

In formula (1), an arylalkylthio group represented by $R^1$ may have a substituent, and usually has about 7 to 60 carbon atoms. Examples of the arylalkylthio group include a phenyl-$C_1$ to $C_{12}$ alkylthio group, a $C_1$ to $C_{12}$ alkoxyphenyl-$C_1$ to $C_{12}$ alkylthio group, a $C_1$ to $C_{12}$ alkylphenyl-$C_1$ to $C_{12}$ alkylthio group, a 1-naphthyl-$C_1$ to $C_{12}$ alkylthio group and a 2-naphthyl-$C_1$ to $C_{12}$ alkylthio group.

A hydrogen atom, an alkyl group and a halogen atom are preferable $R^1$ from the viewpoint of charge transporting characteristic.

Examples of the compound represented by formula (1) include the following compounds:

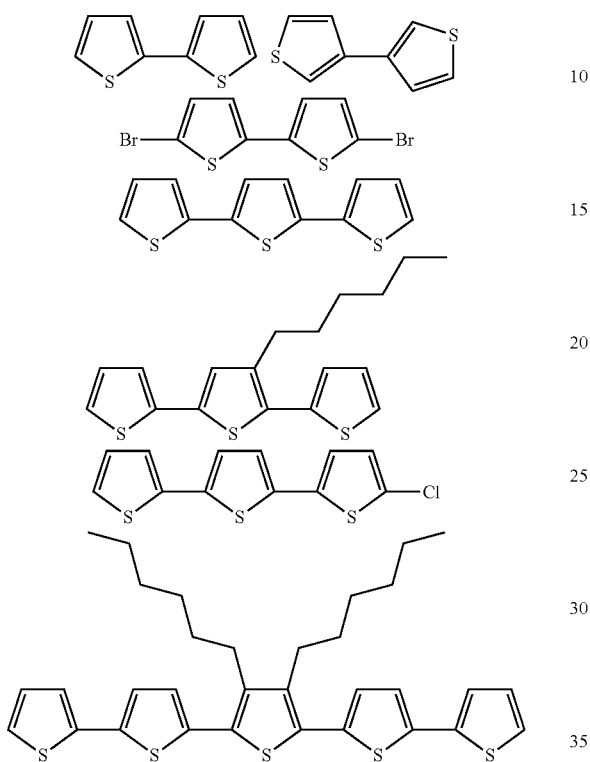

In formula (2), as an alkyl group, an alkoxy group, an alkylthio group, an aryl group, an aryloxy group, an arylthio group, an arylalkyl group, an arylalkoxy group and an arylalkylthio group, represented by $R^2$, the same groups as those of the aforementioned $R^1$ are shown. A halogen atom represented by $R^2$ is exemplified by the same atoms as those of the aforementioned $R^1$.

A hydrogen atom, an alkyl group and a halogen atom are preferable $R^2$ from the viewpoint of charge transporting characteristic.

In formula (2), an alkyl group, an alkoxy group, and an alkylthio group represented by $R^3$ are exemplified by the same groups as those of the aforementioned $R^1$. A halogen atom represented by $R^3$ is exemplified by the same atoms as those of the aforementioned $R^1$.

An alkyl group and a halogen atom are preferable $R^3$ from the viewpoint of charge transporting characteristic.

In formula (2), $Ar^1$ and $Ar^2$ each independently represents an arylene group or a divalent heterocyclic group containing a nitrogen atom.

Here, the arylene group is an atomic group in which two hydrogen atoms are removed from an aromatic hydrocarbon, and includes those having a benzene ring, those having a condensed ring and those having two or more independent benzene rings or condensed rings bonded to one another directly or through a divalent group such as vinylene. The arylene group may have a substituent. As this substituent, a straight-chain or a branched alkyl group having 1 to 20 carbon atoms, a cycloalkyl group having 1 to 20 carbon atoms, an alkoxy group having a straight-chain or a branched alkyl group having 1 to 20 carbon atoms or a cycloalkyl group having 1 to 20 carbon atoms in its structure, or the like is shown. A portion in the arylene group from which the substituent is removed usually has about 6 to 60 carbon atoms, preferably 6 to 20 carbon atoms. The total number of carbon atoms of the arylene group including the substituent is usually about 6 to 100.

Examples of the arylene group include phenylene groups (formulas 1 to 3), naphthalene-diyl groups (formulas 4 to 13), anthracene-diyl groups (formulas 14 to 19), biphenyl-diyl groups (formulas 20 to 25), terphenyl-diyl groups (formulas 26 to 28), condensed-ring compound groups (formulas 29 to 35), fluorene-diyl group (formula 36), benzofluorene-diyl groups (formulas 37 to 39) and dibenzofluorene-diyl group (formula 40).

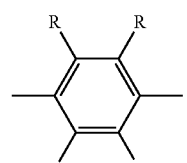

1

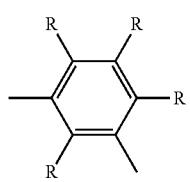

2

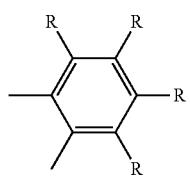

3

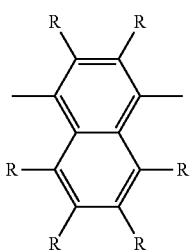

4

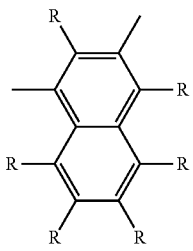

5

-continued
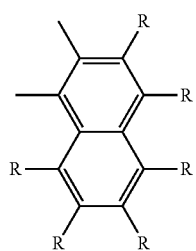
6
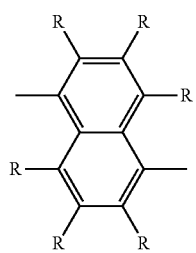
7
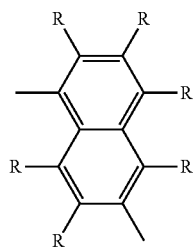
8
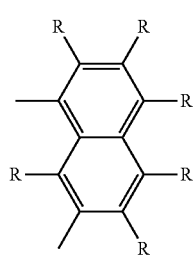
9
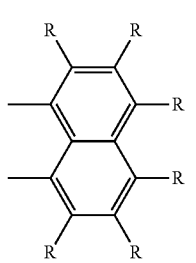
10
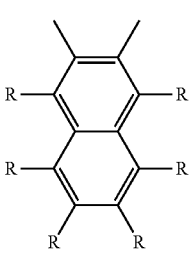
11
-continued
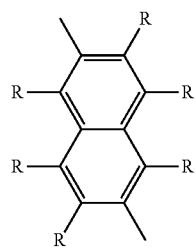
12
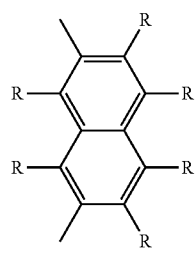
13
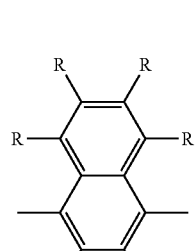
14
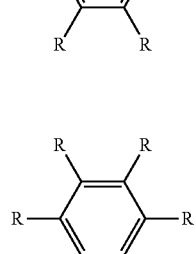
15
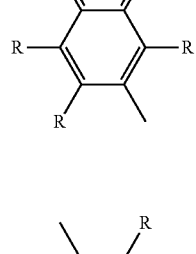
16

17
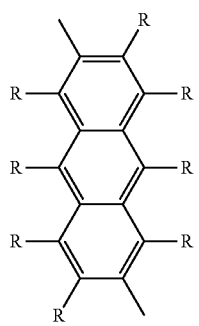
18
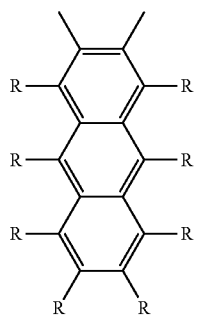
19
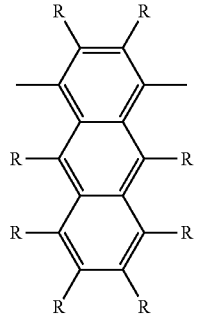
20
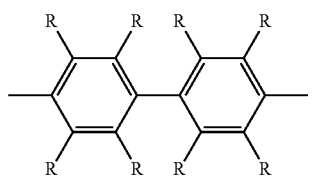
21
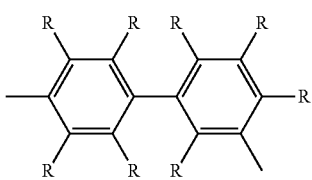
22
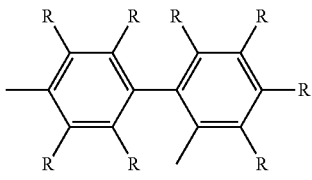
23
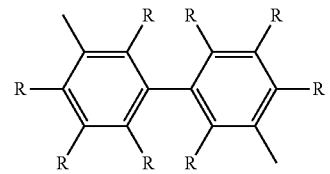
24
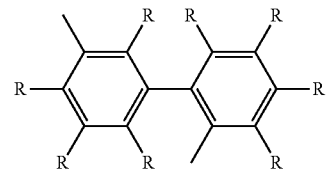
25
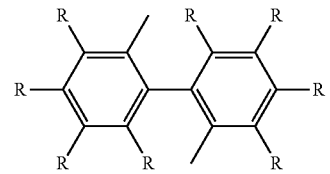
26
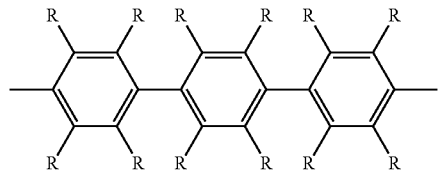
27
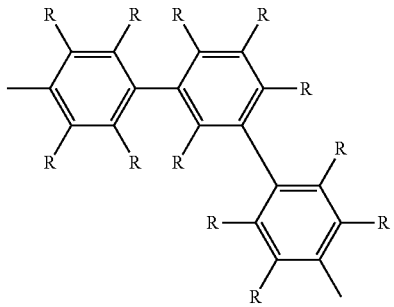
28
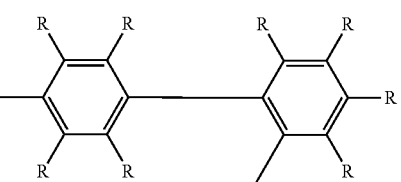
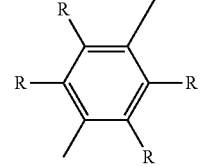
29
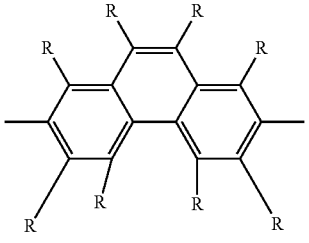

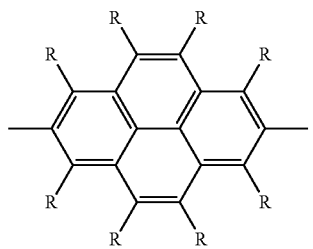

30

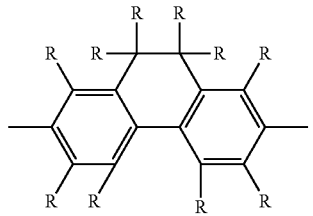

31

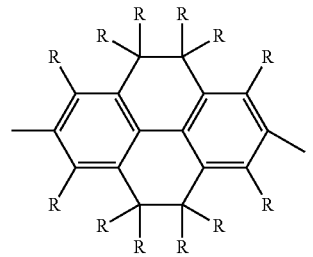

32

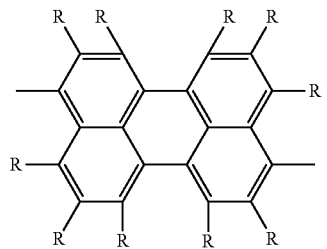

33

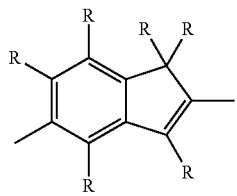

34

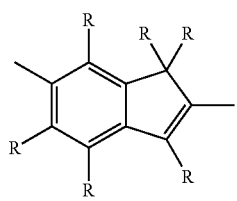

35

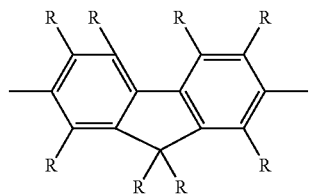

36

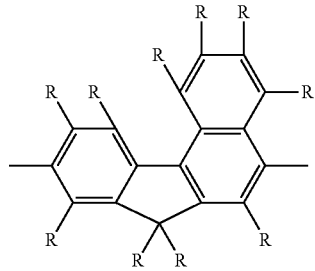

37

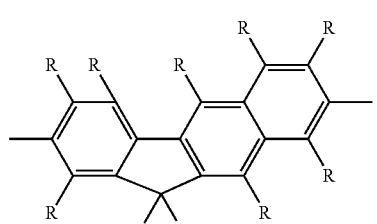

38

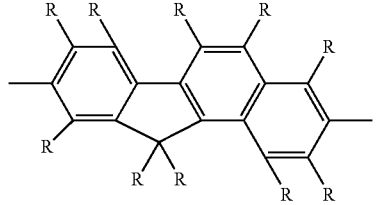

39

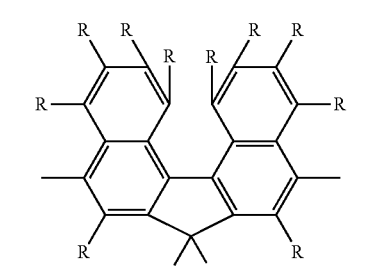

40

(wherein, R represents a hydrogen atom, a halogen atom, an alkyl group, an alkoxy group, an alkylthio group, an aryl group, an aryloxy group, an arylthio group, an arylalkyl group, an arylalkoxy group, or an arylalkylthio group. The plurality of R's may be the same or different.)

In formulas 1 to 40, the alkyl group, alkoxy group, alkylthio group, aryl group, aryloxy group, arylthio group, arylalkyl group, arylalkoxy group and arylalkylthio group, represented by $R^2$ are exemplified by the same groups as those of the aforementioned $R^1$. A halogen atom represented by R is exemplified by the same atoms as those of the aforementioned $R^1$.

The divalent heterocyclic group containing a nitrogen atom refers to the rest of atomic group in which two hydrogen atoms are removed from a heterocyclic compound containing a nitrogen atom, and the divalent heterocyclic group may have a substituent. The heterocyclic compound containing a nitrogen atom refers those having not only carbon atoms but also a nitrogen atom as elements constituting the ring within the ring, among organic compounds having a ring structure. The heterocyclic compound containing a nitrogen atom may also contain an oxygen atom, a sulfur atom, a serene atom or the like within the ring.

An aromatic heterocyclic group is preferable among the divalent heterocyclic groups. The number of carbon atoms of a portion except for the substituent in the divalent heterocyclic group is usually about 3 to 60, and the total number of carbon atoms including the substituent of the divalent heterocyclic group is usually about 3 to 100.

Examples of the divalent heterocyclic group having a nitrogen atom include pyridine-diyl groups (formulas 101 to 106), diazaphenylene groups (formulas 107 to 110), quinoline-diyl groups (formulas 111 to 125), quinoxaline-diyl groups (formulas 126 to 130), acridine-diyl groups (formulas 131 to 134), bipyridyl-diyl groups (formulas 135 to 137), phenanthroline-diyl groups (formulas 138 to 140), 5-membered heterocyclic groups containing a nitrogen atom (formula 141), and 5-membered condensed heterocyclic groups containing a nitrogen atom (formulas 142 to 149).

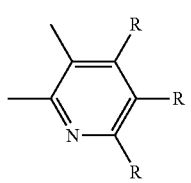
101

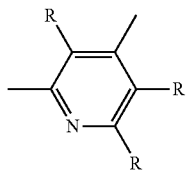
102

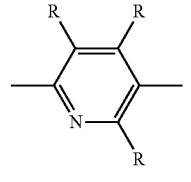
103

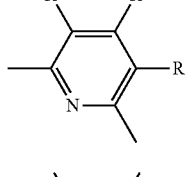
104

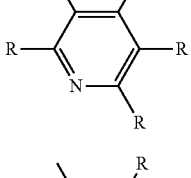
105

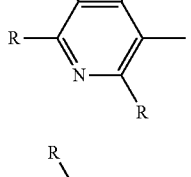
106

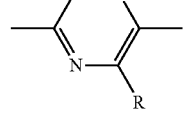
107

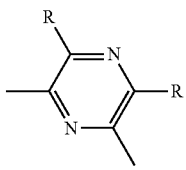
108

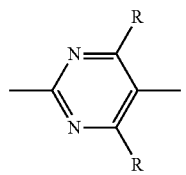
109

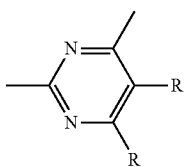
110

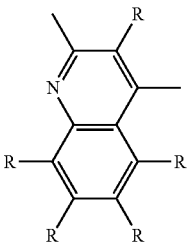
111

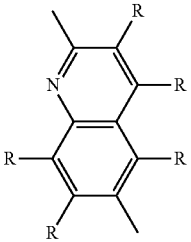
112

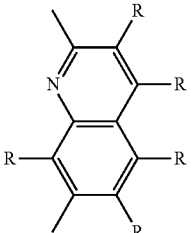
113

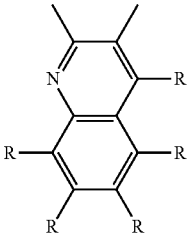
114

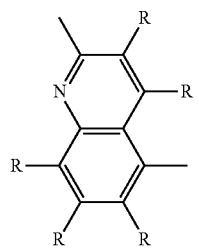 115
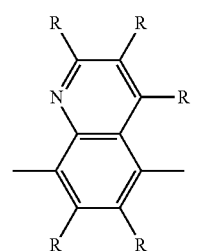 116
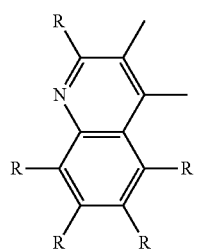 117
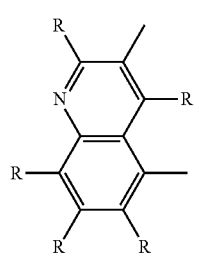 118
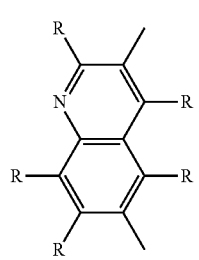 119
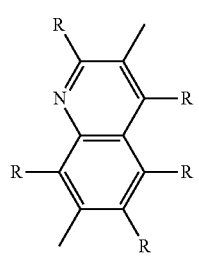 120
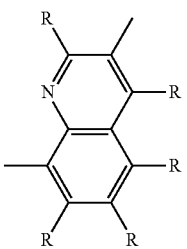 121
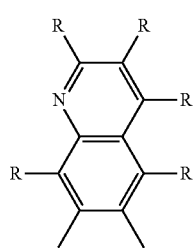 122
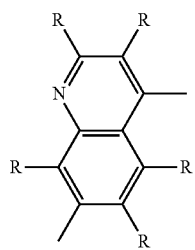 123
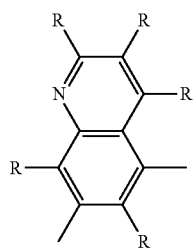 124
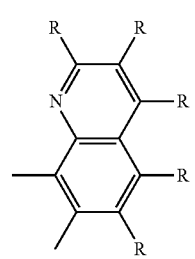 125
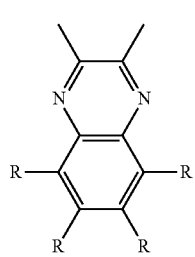 126

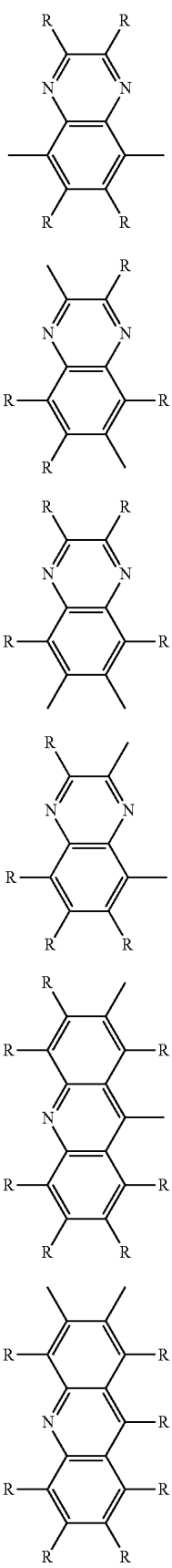
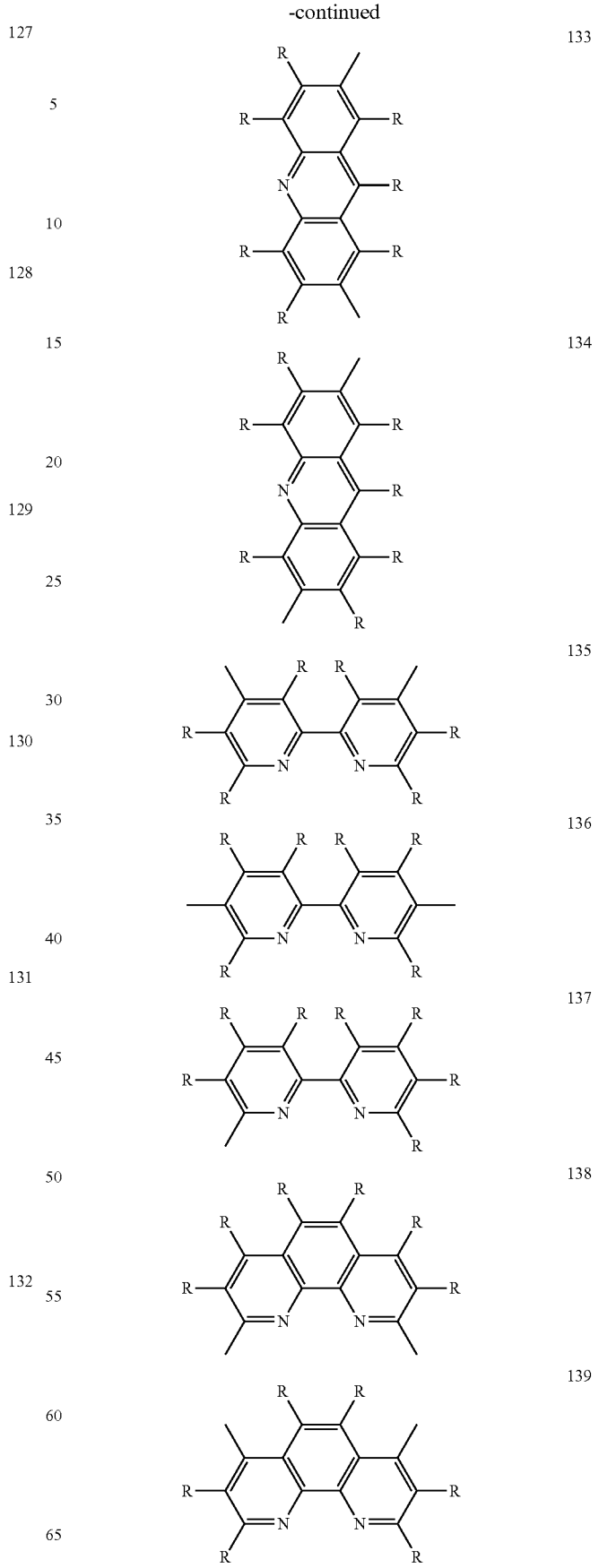

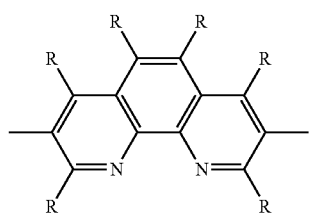
140
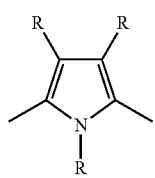
141
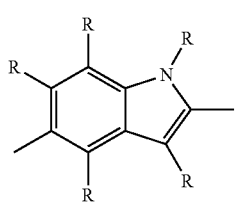
142
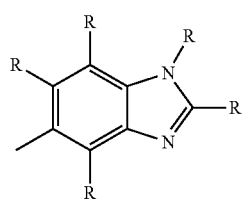
143
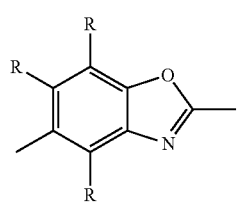
144
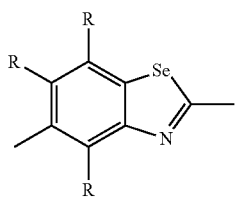
145
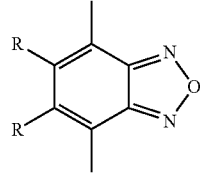
146
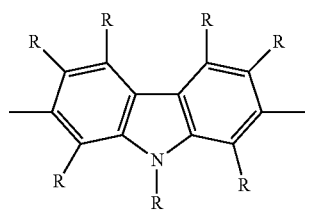
147
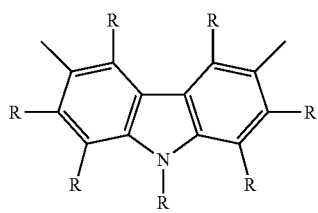
148
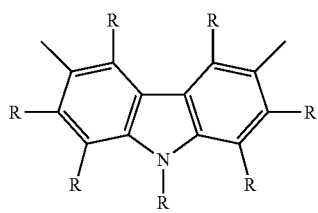
149
(wherein, R is the same as defined above. The plurality of R's may be the same or different.)
Examples of the compound represented by formula (2) include the following compounds.
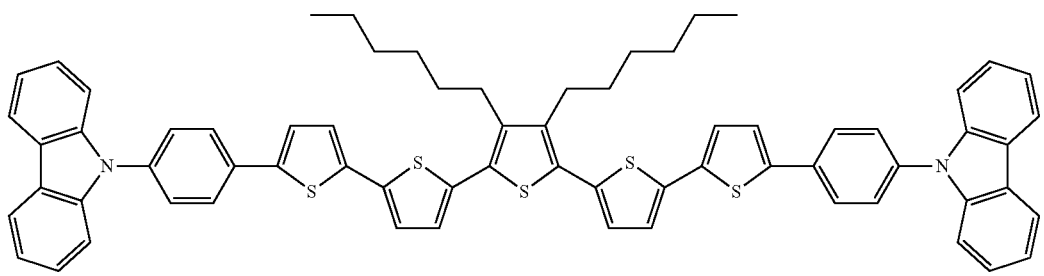

-continued

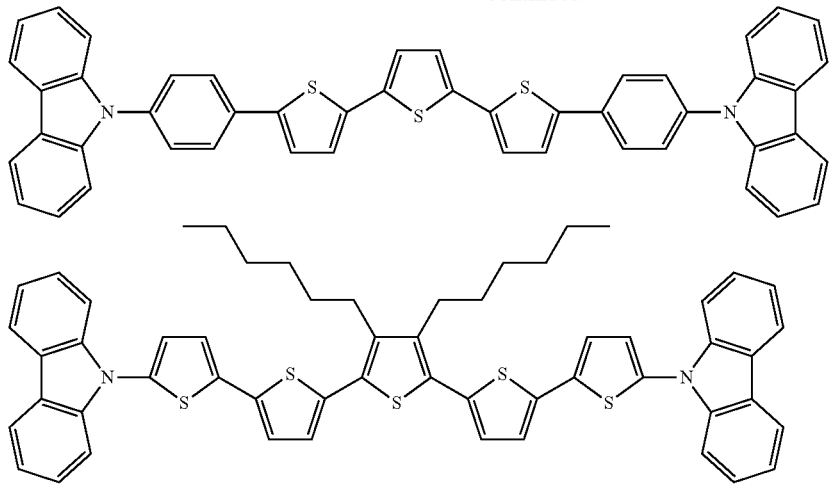

The sulfur-containing heterocyclic compound used in the present invention may have a condensed polycyclic structure. The condensed polycyclic structure refers to a structure in which two or more aromatic rings are condensed (ring-condensed). The condensed polycyclic structure preferably includes a sulfur atom, and more preferably includes 1 to 3 sulfur atoms. Examples of the aromatic ring include a thiophene ring, a benzene ring, a furan ring, a pyrrole ring, a pyridine ring, a thiadiazole ring, a thiazole ring, and the like. The number of condensed aromatic rings is preferably 2 to 20, more preferably 2 to 10, and most preferably 2 to 5. Examples of the condensed polycyclic structure include a structure in which two thiophene rings are condensed, a structure in which a thiophene ring and a benzene ring are condensed, a structure in which a thiadiazole ring and a benzene ring are condensed, a structure in which a thiazole ring and a benzene ring are condensed, a structure in which a thiophene ring and two benzene rings are condensed, a structure in which two thiophene rings and a benzene ring are condensed, and a structure in which two thiophene rings and two benzene rings are condensed.

Examples of the sulfur-containing heterocyclic compound having a condensed polycyclic structure include a compound indicated by formula (3) or a compound indicated by formula (4):

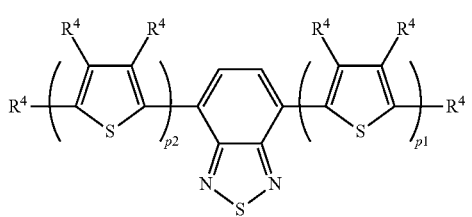

(3)

(wherein, a plurality of $R^4$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group; a hydrogen atom or atoms contained in these groups may be substituted by a fluorine atom or atoms; p1 represents an integer of 0 to 5, and p2 represents an integer of 0 to 5.)

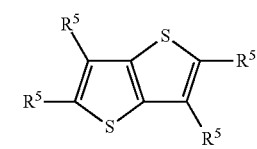

(4)

(wherein, a plurality of $R^5$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group; a hydrogen atom or atoms contained in these groups may be substituted by a fluorine atom or atoms.)

In formula (3), an alkyl group, an alkoxy group, an alkylthio group, an aryl group, an aryloxy group, an arylthio group, an arylalkyl group, an arylalkoxy group and an arylalkylthio group represented by $R^4$ are exemplified by the same groups as those of the aforementioned $R^1$. A halogen atom represented by $R^4$ is exemplified by the same atoms as those of the aforementioned $R^1$.

A hydrogen atom, an alkyl group and a halogen atom are preferable $R^4$ from the viewpoint of charge transporting characteristic.

Examples of the compound represented by formula (3) include the following compounds.

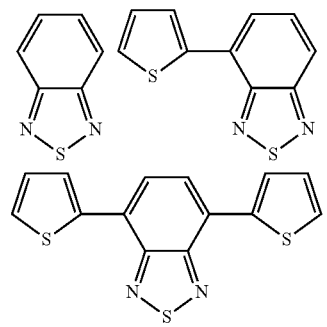

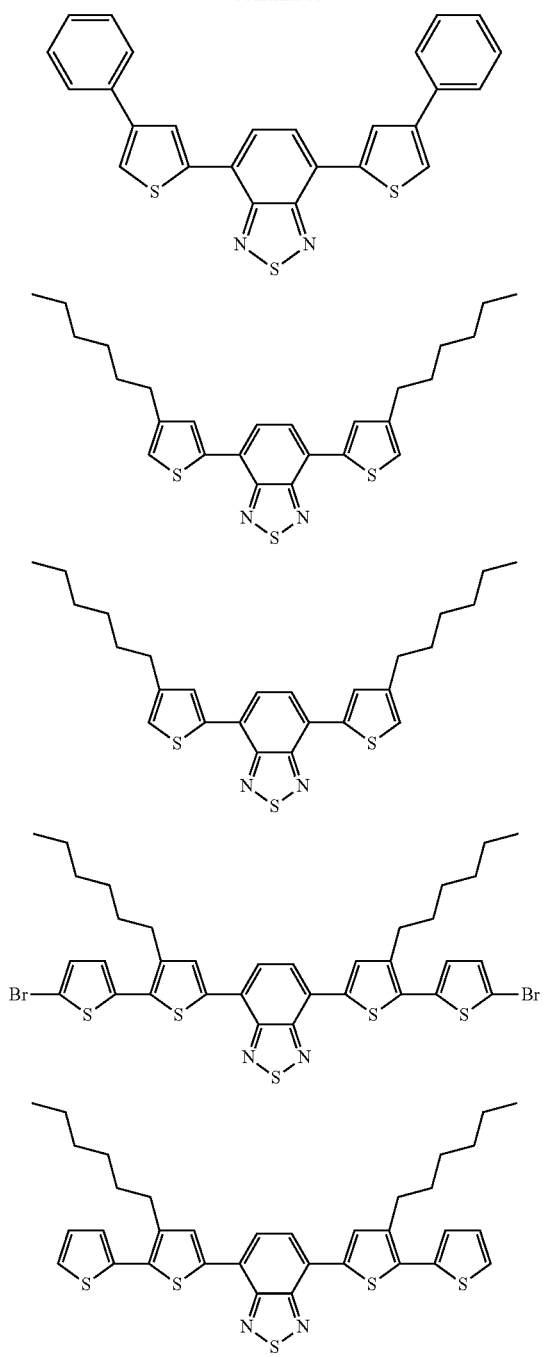

In formula (4), an alkyl group, an alkoxy group, an alkylthio group, an aryl group, an aryloxy group, an arylthio group, an arylalkyl group, an arylalkoxy group and an arylalkylthio group represented by $R^5$ are exemplified by the same groups as those of the aforementioned $R^1$. A halogen atom represented by $R^5$ is exemplified by the same atoms as those of the aforementioned $R^1$.

A hydrogen atom, an alkyl group and a halogen atom are preferable $R^5$ from the viewpoint of charge transporting characteristic.

Examples of the compound represented by formula (4) include the following compounds.

One kind or two or more kinds of the sulfur-containing heterocyclic compounds may be contained in an organic layer possessed by an organic photoelectric conversion device of the present invention.

<Conjugated Polymer Compound>

The conjugated polymer compound used in the present invention refers to (1) a polymer substantially having a structure in which a double bond and a single bond are alternately aligned; (2) a polymer substantially having a structure in which a double bond and a single bond are alternately aligned with a nitrogen atom interposed therebetween; and (3) a polymer substantially having a structure in which a double bond and a single bond are alternately aligned and a structure in which a double bond and a single bond are alternately aligned with a nitrogen atom interposed therebetween. Examples of the conjugated polymer compound include polymers having a structure in which, one kind or two or more kinds of groups, selected from the group consisting of an unsubstituted or substituted fluorene-diyl group, an unsubstituted or substituted benzofluorene-diyl group, an unsubstituted or substituted dibenzofuran-diyl group, an unsubstituted or substituted dibenzothiophene-diyl group, an unsubstituted or substituted carbazole-diyl group, an unsubstituted or substituted thiophene-diyl group, an unsubstituted or substituted furan-diyl group, an unsubstituted or substituted pyrrole-diyl group, an unsubstituted or substituted benzothiadiazole-diyl group, an unsubstituted or substituted phenylenevinylene group, an unsubstituted or substituted thienylenevinylene group and an unsubstituted or substituted triphenylamine-diyl group, is used as a repeat unit, with the repeat units being mutually bonded to each other directly or through a linking group interposed therebetween.

In a case where the conjugated polymer compound has a structure in which the repeat units are mutually bonded to each other with a linking group interposed therebetween, examples of the linking group include phenylene, biphenylene, naphthalene-diyl, anthracene-diyl, and the like.

From the viewpoint of charge transporting characteristic, the conjugated polymer compound used in the present invention preferably has one or more repeat units selected from the group consisting of the following formula (6) and formula (7):

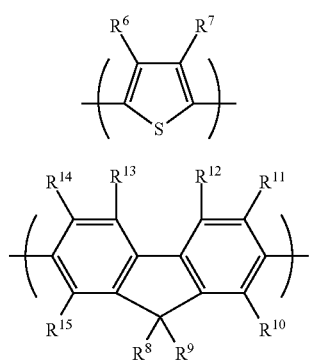

(6)

(7)

(wherein, each of $R^6$, $R^7$, $R^8$, $R^9$, $R^{10}$, $R^{11}$, $R^{12}$, $R^{13}$, $R^{14}$ and $R^{15}$ independently represents a hydrogen atom, an alkyl group, an alkoxy group, an alkylthio group, an aryl group, an aryloxy group, an arylthio group, an arylalkyl group, an arylalkoxy group, or an arylalkylthio group.)

The alkyl group, alkoxy group, alkylthio group, aryl group, aryloxy group, arylthio group, arylalkyl group, arylalkoxy group and arylalkylthio group represented by $R^6$ to $R^{15}$ are exemplified by the same groups as those of the aforementioned $R^1$.

From the viewpoints of film-forming performance and solubility in a solvent, the conjugated polymer compound preferably has a polystyrene reduced weight average molecular weight of $5\times10^2$ to $1\times10^7$, more preferably $1\times10^3$ to $1\times10^6$.

One kind or two kinds or more of the conjugated polymer compounds may be contained in the organic layer possessed by the organic photoelectric conversion device of the present invention.

The conjugated polymer may be synthesized by a process in which, after a monomer having a functional group suitable for a polymerization reaction to be used is synthesized, this is optionally dissolved in an organic solvent, and is polymerized by using a polymerization method such as a known aryl coupling method, by the use of alkali, an appropriate catalyst and a ligand.

<Organic Layer>

The organic layer possessed by the organic photoelectric conversion device of the present invention contains a conjugated polymer compound and a sulfur-containing heterocyclic compound. The weight of the sulfur-containing heterocyclic compound in the organic layer is preferably from 0.1 to 10000 parts by weight, and more preferably from 1 to 1000 parts by weight, relative to 100 parts by weight of the conjugated polymer compound.

The organic layer possessed by the organic photoelectric conversion element of the present invention may further contain an electron accepting compound. Examples of the electron accepting compound include an oxadiazole derivative, anthraquinodimethane and a derivative thereof, benzoquinone and a derivative thereof, naphthoquinone and a derivative thereof, anthraquinone and a derivative thereof, tetracyano anthraquinodimethane and a derivative thereof, a fluorenone derivative, diphenyldicyanoethylene and a derivative thereof, a diphenoquinone derivative, a metal complex of 8-hydroxyquinoline or a derivative thereof, polyquinoline and a derivative thereof, polyquinoxaline and a derivative thereof, polyfluorene and a derivative thereof, fullerenes such as $C_{60}$, and derivatives thereof, carbon nanotube, and a phenanthroline derivative such as 2,9-dimethyl-4,7-diphenyl-1,10-phenanthroline, and among these, fullerenes and derivatives thereof are more preferable.

In a case where the organic layer contains an electron accepting compound, the weight of the electron accepting compound in the organic layer is preferably from 1 to 10000 parts by weight, and more preferably from 10 to 2000 parts by weight, when the total weight of the sulfur-containing heterocyclic compound and the conjugated polymer compound is 100 parts by weight.

Examples of fullerenes include $C_{60}$, $C_{70}$, $C_{84}$ and derivatives thereof. Examples of the derivatives of fullerenes include the following compounds:

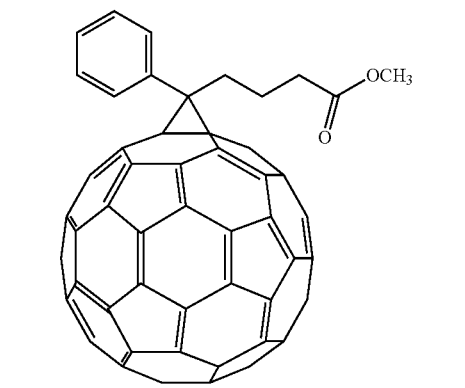

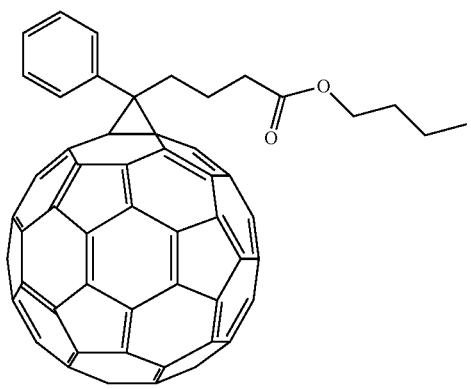

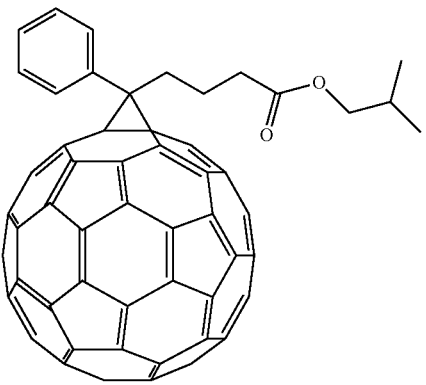

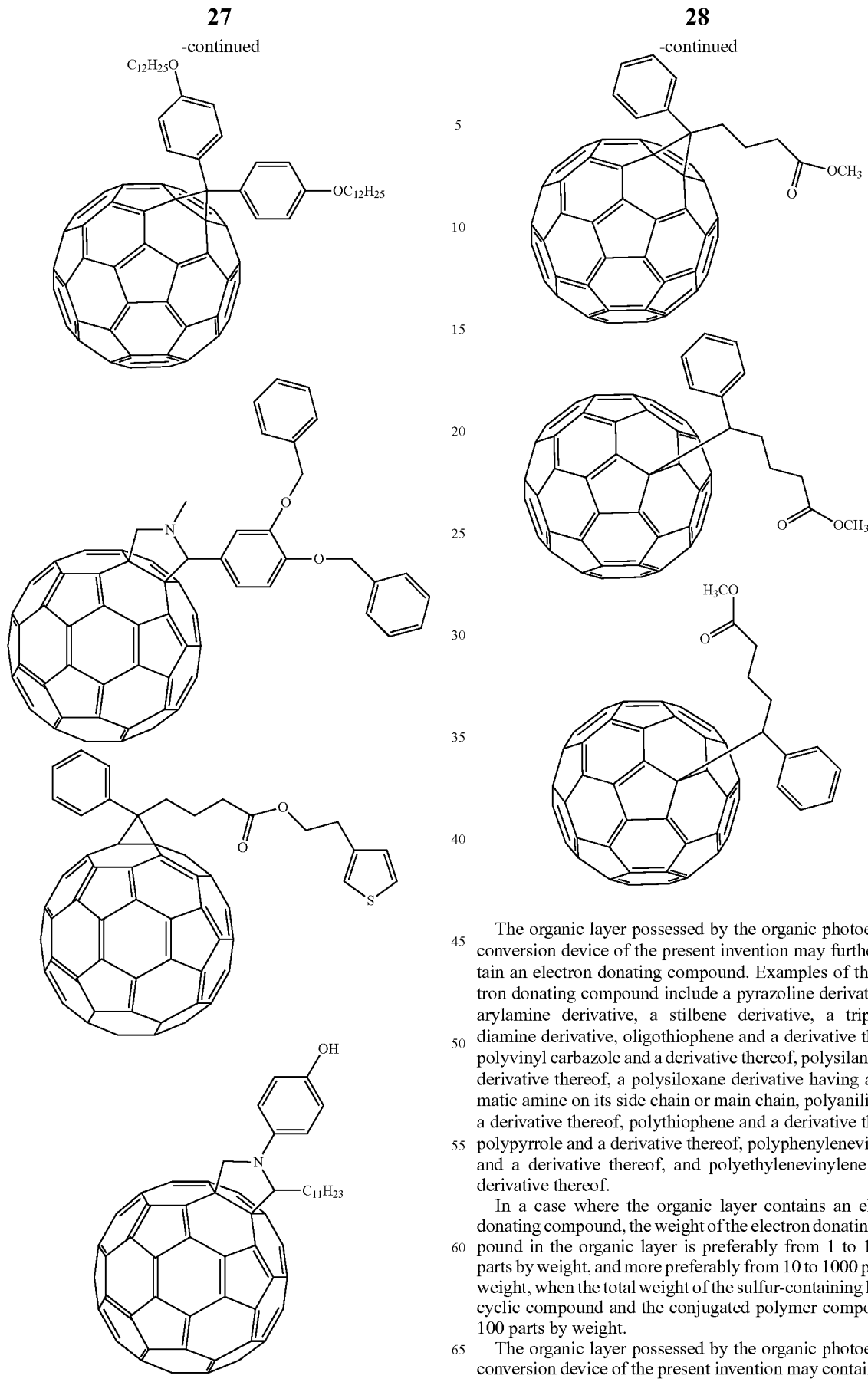

The organic layer possessed by the organic photoelectric conversion device of the present invention may further contain an electron donating compound. Examples of the electron donating compound include a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine on its side chain or main chain, polyaniline and a derivative thereof, polythiophene and a derivative thereof, polypyrrole and a derivative thereof, polyphenylenevinylene and a derivative thereof, and polyethylenevinylene and a derivative thereof.

In a case where the organic layer contains an electron donating compound, the weight of the electron donating compound in the organic layer is preferably from 1 to 100000 parts by weight, and more preferably from 10 to 1000 parts by weight, when the total weight of the sulfur-containing heterocyclic compound and the conjugated polymer compound is 100 parts by weight.

The organic layer possessed by the organic photoelectric conversion device of the present invention may contain components other than the sulfur-containing heterocyclic compound, the conjugated polymer compound, the electron donating compound and the electron accepting compound, as long as the charge transporting characteristic and the charge injecting characteristic are not impaired.

<Organic Photoelectric Conversion Device>

The organic photoelectric conversion device of the present invention has a pair of electrodes, at least either one of which is transparent or semi-transparent, and an organic layer arranged between the electrodes and containing a conjugated polymer compound and a sulfur-containing heterocyclic compound. The composition formed by the conjugated polymer compound and the sulfur-containing heterocyclic compound may be used as an electron accepting compound or as an electron donating compound. In a case where one of the conjugated polymer compound and the sulfur-containing heterocyclic compound is the electron donating compound, and the other is the electron accepting compound, both of the compounds sometimes have both of the functions as the electron donating compound and the electron accepting compound. Among these modes, the composition is preferably used as the electron donating compound.

Then, an operation mechanism of the organic photoelectric conversion device will be described. Optical energy, made incident on the transparent or semi-transparent electrode, is absorbed by the electron accepting compound and/or the electron donating compound, and excitons, each formed by an electron and a hole coupled to each other, are generated. When the generated exciton is moved to reach a heterojunction interface at which the electron accepting compound and the electron donating compound are adjacent to each other, the electron and the hole are separated due to a difference in the HOMO energy and LUMO energy of the respective compounds on the interface so that a charge (an electron and a hole) that can move independently is generated. The charge thus generated is transferred to each of the corresponding electrodes, and can be taken out as an electric energy (current).

Voc (open-circuit voltage) refers to a voltage obtained at the time when an electric current to flow outside is zero, and the fact that the value of Voc is kept high forms one of factors that allow the photoelectric conversion device to exhibit high photoelectric conversion efficiency.

Examples of the organic photoelectric conversion device of the present invention include:

1. An organic photoelectric conversion device that has a pair of electrodes, a first organic layer arranged between the electrodes and containing a conjugated polymer compound and a sulfur-containing heterocyclic compound, and a second organic layer arranged adjacent to the first organic layer and containing an electron donating compound;
2. An organic photoelectric conversion device that has a pair of electrodes, a first organic layer arranged between the electrodes and containing an electron accepting compound, and a second organic layer arranged adjacent to the first organic layer and containing a conjugated polymer compound and a sulfur-containing heterocyclic compound;
3. An organic photoelectric conversion device that has a pair of electrodes, and at least one organic layer arranged between the electrodes and containing a conjugated polymer compound, a sulfur-containing heterocyclic compound and an electron donating compound;
4. An organic photoelectric conversion device that has a pair of electrodes, and an organic layer arranged between the electrodes and containing a conjugated polymer compound, a sulfur-containing heterocyclic compound and an electron accepting compound; and
5. An organic photoelectric conversion device that has a pair of electrodes, and at least one organic layer arranged between the electrodes and containing a conjugated polymer compound, a sulfur-containing heterocyclic compound and an electron accepting compound, with the electron accepting compound being a fullerene derivative.

In the organic photoelectric conversion device of the above-mentioned 5, the weight of the fullerene derivative in the organic layer is preferably from 10 to 1000 parts by weight, and more preferably from 50 to 500 parts by weight, when the total of the weight of the sulfur-containing heterocyclic compound and the weight of the conjugated polymer compound is 100 parts by weight.

From the viewpoint that many hetero-junction interfaces are included, the above-mentioned 3, 4 or 5 is preferable as the organic photoelectric conversion device of the present invention, and the above-mentioned 5 is more preferable. In the organic photoelectric conversion device of the present invention, an additional layer may be arranged between at least one of the electrodes and the organic layer in the device. For example, the additional layer is exemplified by a charge transporting layer used for transporting holes or electrons.

In a case where a composition of a conjugated polymer compound and a sulfur-containing heterocyclic compound is used as an electron donor, an electron acceptor preferably used for the organic photoelectric conversion device is made such that the HOMO energy of the electron acceptor is higher than the HOMO energy of the conjugated polymer compound and the HOMO energy of the sulfur-containing heterocyclic compound, and the LUMO energy of the electron acceptor is higher than the LUMO energy of the conjugated polymer compound and the LUMO energy of the sulfur-containing heterocyclic compound. Moreover, in a case where the composition of a conjugated polymer compound and a sulfur-containing heterocyclic compound is used as an electron acceptor, an electron donor preferably used for the organic photoelectric conversion device is made such that the HOMO energy of the electron donor is lower than the HOMO energy of the conjugated polymer compound and the HOMO energy of the sulfur-containing heterocyclic compound, and the LUMO energy of the electron donor is lower than the LUMO energy of the conjugated polymer compound and the LUMO energy of the sulfur-containing heterocyclic compound.

The organic photoelectric conversion device of the present invention is usually formed on a substrate. This substrate may be any substrate as long as an electrode is formed thereon and no change occurs upon forming an organic layer thereon. Examples of the material for the substrate include glass, a plastic material, a polymer film and silicon. In a case of an opaque substrate, the opposed electrode (that is, an electrode farther from the substrate) is preferably made transparent or semi-transparent.

Examples of a material for the transparent or semi-transparent electrode include a conductive metal oxide film and a semi-transparent metal thin film. Specific examples thereof include a film (NESA or the like) made of a conductive material such as indium oxide, zinc oxide, tin oxide, as well as indium-tin-oxide (ITO) and indium-zinc-oxide that are composites of them, and gold, platinum, silver or copper. ITO, indium-zinc-oxide and zinc oxide are preferable among these. Examples of the producing method of the electrode include a vapor deposition method, a sputtering method, an ion plating method and a plating method. As the electrode material, an organic transparent conductive film, made of polyaniline and its derivative, polythiophene and its derivative, or the like, may be used. Moreover, as the electrode material, metals and conductive polymers can be used. As a material for one of the paired electrodes, a material having a small work function is preferably used, and specific examples include: metals such as lithium, sodium, potassium, rubidium, cesium, magnesium, calcium, strontium, barium, aluminum, scandium, vanadium, zinc, yttrium, indium, cerium, samarium, europium, terbium and ytterbium, and an alloy made of any two or more of these, or an alloy made of at least one of these and at least one selected from the group consisting of gold, silver, platinum, copper, manganese, titanium, cobalt, nickel, tungsten and tin, and graphite, or an graphite interlayer compound or the like. Examples of the alloy include: a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

As the material used for the charge transporting layer serving as the additional layer, that is, a hole transporting layer and an electron transporting layer, the aforementioned electron donating compound and electron accepting compound can be respectively used.

As a material for a buffer layer serving as the additional layer, fine particles or the like of an inorganic semiconductor, such as a halide and an oxide of alkali metal or alkali earth metal, for example, lithium fluoride, and titanium oxide, can be used.

As the organic layer in the organic photoelectric conversion element of the present invention, for example, an organic thin film containing a conjugated polymer compound and a sulfur-containing heterocyclic compound can be used.

The organic thin film has a thickness of usually 1 nm to 100 µm, preferably 2 nm to 1000 nm, more preferably 5 nm to 500 nm, and most preferably 20 nm to 200 nm.

In order to improve the hole transporting characteristic of the organic thin film, a low-molecular compound other than the sulfur-containing heterocyclic compound and/or a polymer other than the conjugated polymer compound as an electron donating compound and/or an electron accepting compound may be mixed, and used in the organic thin film.

<Method of Producing Organic Thin Film>

The organic layer contained in the organic photoelectric conversion device of the present invention can be produced by using a composition of a conjugated polymer compound and a sulfur-containing heterocyclic compound. In a case where the organic layer further contains an electron accepting compound, it can be produced by using a composition of a conjugated polymer compound, a sulfur-containing heterocyclic compound and an electron accepting compound. In a case where the organic layer further contains an electron donating compound, it can be produced by using a composition of a conjugated polymer compound, a sulfur-containing heterocyclic compound and an electron donating compound.

The weight of the sulfur-containing heterocyclic compound in the composition is preferably 0.1 to 10000 parts by weight, and more preferably 1 to 1000 parts by weight, relative to 100 parts by weight of the conjugated polymer compound. In a case where an electron accepting compound is contained in the composition, the weight of the electron accepting compound in the composition is preferably 1 to 10000 parts by weight, and more preferably to 10 to 2000 parts by weight, when the total of the weight of the sulfur-containing heterocyclic compound and the weight of the conjugated polymer compound is 100 parts by weight. In a case when an electron donating compound is contained in the composition, the weight of the electron donating compound in the composition is preferably 1 to 100000 parts by weight, and more preferably 10 to 1000 parts by weight, when the total of the weight of the sulfur-containing heterocyclic compound and the weight of the conjugated polymer compound is 100 parts by weight.

As the producing method of the organic thin film, not particularly limited, for example, a method for forming a film from a solution containing the above-mentioned compound and a solvent and a vapor deposition method are shown, and the method for forming a film from a solution containing the composition and a solvent is more preferable.

With respect to the solvent used for forming a film from a solution, not particularly limited, any solvent may be used as long as it can dissolve the conjugated polymer compound and the sulfur-containing heterocyclic compound. Examples of the solvent include unsaturated hydrocarbon solvents such as toluene, xylene, mesitylene, tetralin, decalin, bicyclohexyl, n-butylbenzene, sec-butylbenzene and tert-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane; halogenated unsaturated hydrocarbon solvents such as chlorobenzene, dichlorobenzene and trichlorobenzene; and ether solvents such as tetrahydrofuran and tetrahydropyran. The composition of the conjugated polymer compound and the sulfur-containing heterocyclic compound used in the present invention can be usually dissolved in the solvent at a ratio of 0.1% by weight or more.

As the film-forming method from a solution, the following coating methods may be used, namely, a spin coating method, a casting method, a micro-gravure coating method, a gravure coating method, a bar coating method, a roll coating method, a wire-bar coating method, a dip coating method, a spray coating method, a screen printing method, a flexographic printing method, an offset printing method, an inkjet printing method, a dispenser printing method, a nozzle coating method and a capillary coating method, and among these, the spin coating method, flexographic printing method, inkjet printing method and dispenser method are preferable.

<Use of Device>

The organic photoelectric conductive device is used through a process in which, upon irradiation with light such as solar light from the transparent or semi-transparent electrode, a photo-electromotive force is generated between the electrodes so as to be operated as an organic thin-film solar battery. By integrating a plurality of organic thin-film solar batteries, the device can be used as an organic thin-film solar battery module.

By irradiating the device with light from the transparent or semi-transparent electrode, with a voltage being applied between the electrodes, a photoelectric current is allowed to flow so that the resulting device can also be operated as an organic photo-sensor. By integrating a plurality of the organic photo-sensors, the resulting device can also be used as an organic image sensor.

EXAMPLES

The following description will describe examples so as to explain the present invention in more detail; however, the present invention is not limited thereto.

—Measuring Method for Molecular Weight—

In the following examples, the molecular weight of a polymer (polymer compound) was determined by using a GPC (PL-GPC2000) manufactured by GPC Laboratory. The polymer was dissolved in o-dichlorobenzene so as to have a concentration of about 1% by weight. As a mobile phase for GPC, o-dichlorobenzene was used, and this was allowed to flow at a flow rate of 1 mL/min. The measuring temperature was 140° C. As a column, three PLGEL 10 μm-MIXED-B's (manufactured by PL Laboratory) were joined in series, and used.

Synthesis Example 1

Synthesis of Conjugated Polymer Compound 1

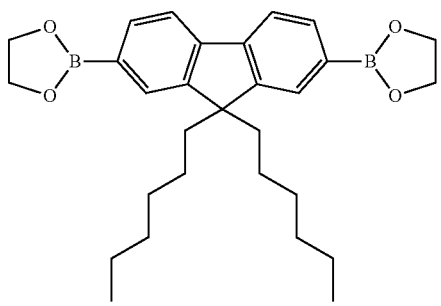
(C)

A compound C (7.928 g, 16.72 mmol), a compound D (13.00 g, 17.60 mmol), methyltrioctyl ammonium chloride (trade name: aliquat336, manufactured by Aldrich, $CH_3N[CH_2]_7CH_3)_3Cl$, density 0.884 g/mL, 25° C., trademark of Henkel Corporation) (4.979 g) and toluene (405 mL) were charged into a 2-L four-neck flask replaced with argon, and this system was subjected to bubbling with argon gas for 30 minutes while being stirred. Dichlorobis(triphenylphosphine)palladium (II) (0.02 g) was added thereto, and then heated to 105° C., and to this mixture was further added dropwise an aqueous 2 mol/L sodium carbonate solution (42.2 mL) while being stirred. After completing the addition, the mixture was allowed to react for 5 hours, and phenylboric acid (2.6 g) and toluene (1.8 mL) were added thereto, and stirred at 105° C. for 16 hours. Further, toluene (700 mL) and an aqueous 7.5% sodium diethylthiocarbamate trihydrate solution (200 mL) were added thereto, and stirred at 85° C. for 3 hours. After removing the water layer, the organic layer was washed with 300 mL of ion exchange water at 60° C. two times, then washed with 300 mL of 3% acetic acid at 60° C. once, and further washed with 300 mL of ion exchange water at 60° C. three times. The organic layer was allowed to pass through a column filled with celite, alumina and silica, and the column was washed with heated toluene (800 mL). The resulting solution was condensed up to 700 mL, and then poured into 2 L of methanol to be re-precipitated. A polymer was recovered by filtration, and was then washed with 500 mL of methanol, acetone and methanol. This was then vacuum-dried for one night at 50° C. so that a pentathienyl-fluorene copolymer (hereinafter, referred to as "conjugated polymer compound 1") (12.21 g), represented by the following formula, was obtained.

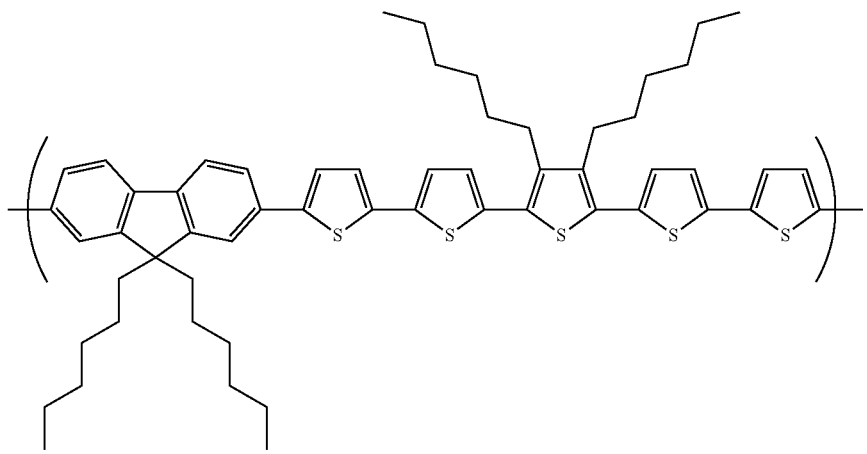

The conjugated polymer compound 1 had a number-average molecular weight of $5.4 \times 10^4$ and a weight-average molecular weight of $1.1 \times 10^5$, in terms of polystyrene equivalent.

Synthesis Example 2

Synthesis Example of Compound E

-continued
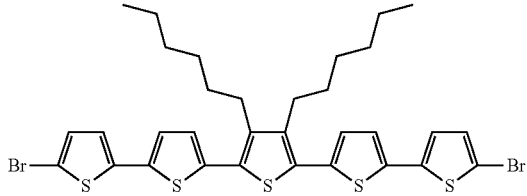
(D)

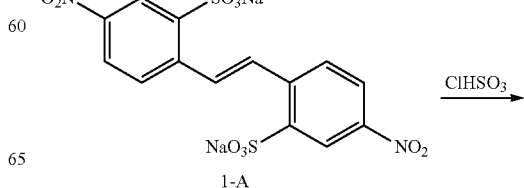

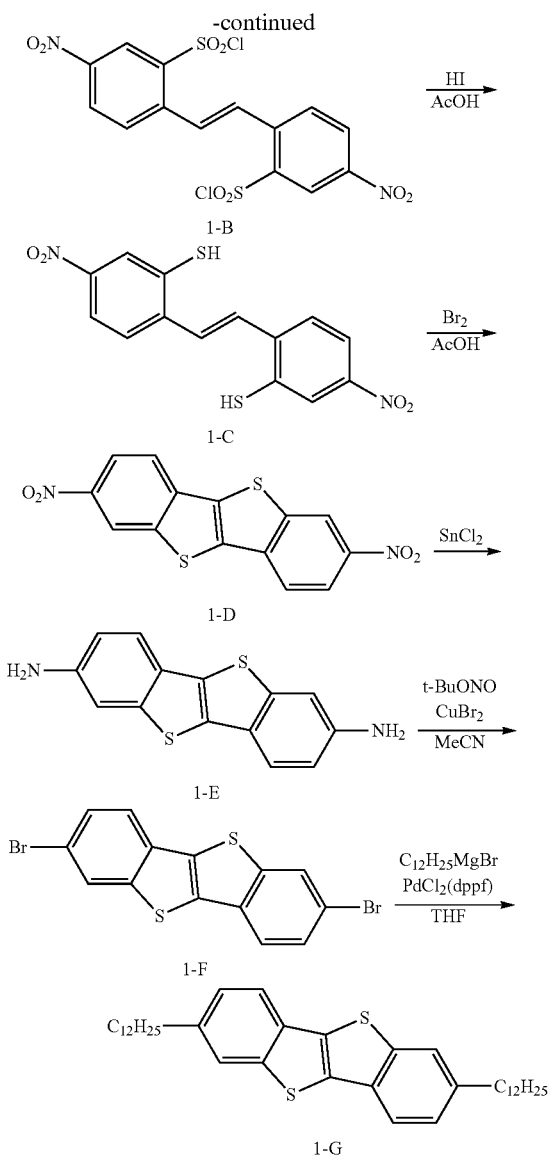

In accordance with the method of Zh. Origani. Khimi, 1980, 16, 430-438, a compound (1-A), a commercially available compound, was heated in chlorosulfonic acid to be quantitatively converted to a compound (1-B). Next, the compound (1-B) was suspended in acetic acid, and to this was added 55% hydroiodic acid and heated, and after a precipitated compound (1-C) thus generated was collected by filtration, the resulting compound was again suspended in acetic acid, and to this was added bromine and heated to obtain a compound (1-D) as a yellow precipitate.

The compound (1-D) (50 g, 150 mmol), tetrahydrofuran (THF) (300 mL), ethyl acetate (300 mL) and tin chloride (II) dihydrate ($SnCl_2 \cdot 2H_2O$) (120 g, 530 mmol) were charged into a 1-L four-neck flask, and stirred, and this system was subjected to bubbling with argon gas for 1 hour. Thereafter, this was heated and stirred at 80° C. for 8 hours. The solvent in the resulting suspension was removed under reduced pressure, and the remaining solid was charged into 1 L of water. To this suspension was added sodium hydroxide (NaOH) little by little while being stirred, so that the pH was adjusted to 10, and the resulting precipitate was collected by filtration. To this was added THF (500 mL), and heated and stirred at 80° C. for 30 minutes, and this suspension was filtered to obtain a THF solution of a compound (1-E). To the solid collected by filtration was further added THF (300 mL), this was heated and stirred at 80° C. for 30 minutes, and this suspension was filtered to obtain a THF solution of a compound (1-E). To the solid collected by filtration was further added THF (300 mL), this was heated and stirred at 80° C. for 30 minutes, and this suspension was filtered to obtain a THF solution of a compound (1-E). The THF solutions of the compound (1-E), thus obtained, were combined, and condensed to obtain a compound (1-E) (35 g, 86% yield).

The compound (1-E) (35 g, 130 mmol), acetonitrile (450 mL) and copper bromide (II) ($CuBr_2$) (65 g, 290 mmol) were charged into a 1-L four-neck flask, and this system was subjected to bubbling with nitrogen gas for 30 minutes while being stirred. This suspension was cooled to 0° C., and to this was further added dropwise an aqueous tertiary butyl phosphite (t-BuONO) solution (30 g, 290 mmol) and acetonitrile (190 mL). After being stirred at 0° C. for 3 hours as well as at room temperature for 6 hours, the resulting suspension was added to water (1 L).

To this was added an aqueous 35% hydrochloric acid solution (60 mL) and stirred. To the solid collected by filtration was added THF (300 mL), and heated and stirred at 80° C. for 30 minutes, and this suspension was filtered to obtain a THF solution of a compound (1-F). To the solid collected by filtration was further added THF (300 mL), this was heated and stirred at 80° C. for 30 minutes, and this suspension was filtered to obtain a THF solution of a compound (1-F). The THF solutions of the compound (1-F), thus obtained, were combined, and condensed to obtain a compound (1-F) (40 g, 77% yield).

The compound (1-F) (10 g, 25 mmol) and THF (500 mL) were charged into a 1-L four-neck flask and stirred, and this system was subjected to bubbling with nitrogen gas for 30 minutes. Into this suspension was charged dichloropalladium (II) diphenylphosphinoferrocene ($PdCl_2(dppf)$) (1.4 g, 2.5 mmol). To this was further added dropwise dodecylmagnesium bromide ($C_{12}H_{25}MgBr$) (1M-THF solution, 75 mL, 75 mmol). After completing the addition, this was allowed to react at 75° C. for 3 hours. The resulting solution was condensed and extracted with toluene. After being washed with an aqueous hydrochloric acid solution and water, the resultant was again condensed. The resulting coarse product was purified by silica-gel column chromatography. This was re-crystallized with heated toluene to obtain a compound (1-G) (1.7 g, 11% yield). The compound (1-G) is referred to as compound E.

Synthesis Example 3

Synthesis Example of Compound J

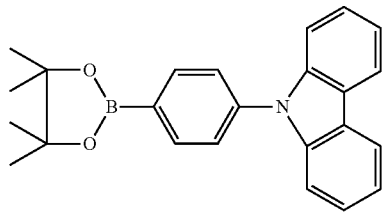 [SMILES: CC1(C)OB(c2ccc(-n3c4ccccc4c4ccccc43)cc2)OC1(C)C]

The compound D (0.739 g), a monomer (0.813 g) represented by the above structural formula, methyltrioctyl ammonium chloride (trade name: aliquat336, manufactured by Aldrich, $CH_3N[CH_2)_7CH_3]_3Cl$, density 0.884 g/mL, 25° C., trademark of Henkel Corporation) (0.36 g), palladium acetate (II) (11.0 mg) and tris(2-methoxyphenyl)phosphine (56.7 mg) were charged into a reaction container, and the inside of the reaction container was sufficiently replaced with argon gas. To this reaction container was added toluene (30 mL) preliminarily subjected to bubbling with argon gas, and degassed. Next, after adding dropwise to this solution an aqueous 16.7 wt % sodium carbonate solution (7 mL) preliminarily subjected to bubbling with argon gas, and degassed, the resulting solution was heated, and refluxed for 17 hours. Additionally, the reaction was carried out under an argon gas atmosphere.

After completion of the reaction, the reaction solution was cooled to about room temperature, the resulting reaction solution was then left to stand, and a toluene layer solution-separated was recovered. Next, the resulting toluene layer was poured into methanol and re-precipitated and the precipitate thus generated was collected. The resulting precipitate was dried under reduced pressure, and then dissolved in chloroform. The resulting chloroform solution was filtered so that, after insoluble matters were removed, the resulting solution was then purified through an alumina column. Next, the resulting chloroform solution was poured into methanol, and re-precipitated to recover the resulting precipitate. After being washed with methanol, the resulting precipitate was dried under reduced pressure to obtain a compound J (0.55 g).

The structure of the compound J, estimated by the charged materials, is represented by the following formula:

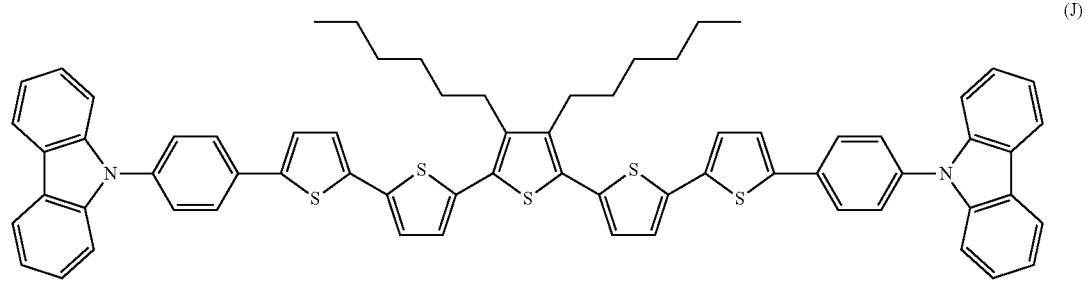 [SMILES: CCCCCCc1c(-c2ccc(-c3ccc(-c4ccc(-n5c6ccccc6c6ccccc65)cc4)s3)s2)sc(-c2ccc(-c3ccc(-c4ccc(-n5c6ccccc6c6ccccc65)cc4)s3)s2)c1CCCCCC]

(J)

Example 1

Production and Evaluation of Organic Thin-Film Solar Battery

The conjugated polymer compound 1 was dissolved in o-dichlorobenzene at a concentration of 0.5% (weight %). Thereafter, the compound (D) serving as a sulfur-containing heterocyclic compound with a weight equivalent to the weight of the conjugated polymer compound 1, and also C60PCBM (Phenyl C61-butyric acid methyl ester, manufactured by Frontier Carbon Corporation; trade name: E100) with a weight three times as much as the total weight of the conjugated polymer compound 1 and the compound (D) as an electron acceptor were mixed with the solution. Next, the solution was filtered with a Teflon (registered trademark) filter of 1.0 μm to produce a coating solution.

A glass substrate on which an ITO film was deposited with a thickness of 150 nm by a sputtering method was subjected to a surface treatment with an ozone UV treatment. Next, the coating solution was applied by a spin coating method to obtain an active layer (film thickness: about 100 nm) for an organic thin-film solar battery. Thereafter, lithium fluoride was vapor-deposited thereon with a thickness of 4 nm, and Al was then vapor-deposited thereon with a thickness of 100 nm, by using a vacuum vapor depositing machine. Upon the vapor deposition, the degree of vacuum was 1 to $9\times10^{-3}$ Pa in all cases. The shape of the resulting organic thin-film solar battery had a square shape of 2 mm×2 mm.

A Voc (open-circuit voltage) and an FF (fill factor, shape factor) of the resulting organic thin-film solar battery were measured by using a solar simulator (trade name: OTENTO-SUNII, manufactured by Bunkoukeiki Co., Ltd.: AM1.5G filter, irradiance 100 mW/cm$^2$). The results of measurements are shown in Table 1.

Example 2

Production and Evaluation of Organic Thin-Film Solar Battery

The photoelectric conversion characteristic of an organic thin-film solar battery was measured in the same manner as that of example 1, except that the compound (E) was used in place of the compound (D). The results of measurements are shown in Table 1.

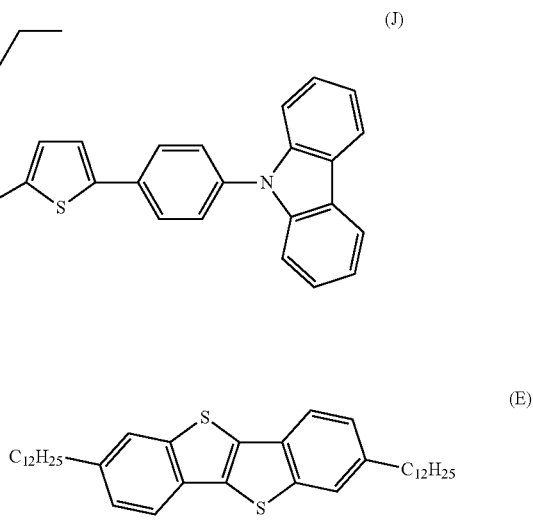

(E)

Example 3

Production and Evaluation of Organic Thin-Film Solar Battery

The photoelectric conversion characteristic of an organic thin-film solar battery was measured in the same manner as that of example 1, except that the compound (F) was used in place of the compound (D). The results of measurements are shown in Table 1.

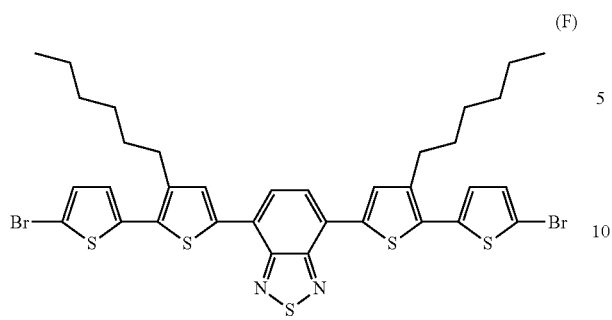

(F)

Example 4

Production and Evaluation of Organic Thin-Film Solar Battery

The photoelectric conversion characteristic of an organic thin-film solar battery was measured in the same manner as that of example 1, except that the compound (G) was used in place of the compound (D). The results of measurements are shown in Table 1.

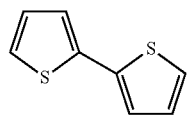

(G)

Example 5

Production and Evaluation of Organic Thin-Film Solar Battery

The photoelectric conversion characteristic of an organic thin-film solar battery was measured in the same manner as that of example 1, except that the compound (H) was used in place of the compound (D). The results of measurements are shown in Table 1.

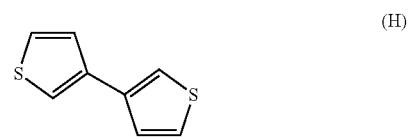

(H)

Example 6

Production and Evaluation of Organic Thin-Film Solar Battery

The photoelectric conversion characteristic of an organic thin-film solar battery was measured in the same manner as that of example 1, except that the compound (I) was used in place of the compound (D). The results of measurements are shown in Table 1.

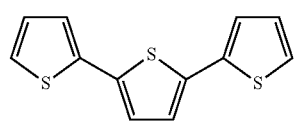

(I)

Example 7

Production and Evaluation of Organic Thin-Film Solar Battery

The photoelectric conversion characteristic of an organic thin-film solar battery was measured in the same manner as that of example 1, except that the compound (J) was used in place of the compound (D). The results of measurements are shown in Table 1.

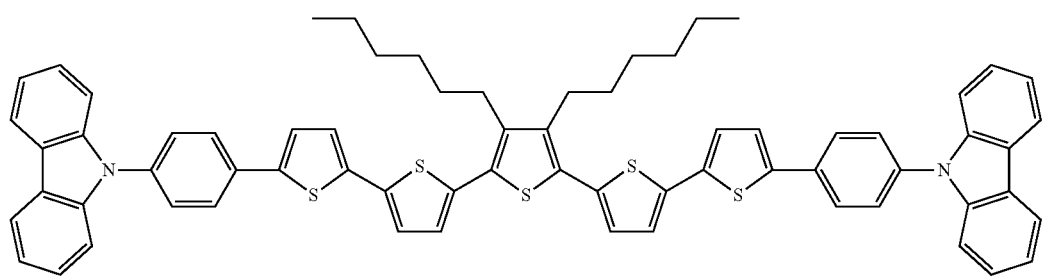

(J)

Example 8

Production and Evaluation of Organic Thin-Film Solar Battery

The photoelectric conversion characteristic of an organic thin-film solar battery was measured in the same manner as that of example 1, except that the compound (K) was used in place of the compound (D). The results of measurements are shown in Table 1.

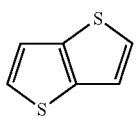

Example 9

Production and Evaluation of Organic Thin-Film Solar Battery

The photoelectric conversion characteristic of an organic thin-film solar battery was measured in the same manner as that of example 1, except that the compound (L) was used in place of the compound (D). The results of measurements are shown in Table 1.

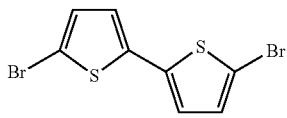

Example 10

Production and Evaluation of Organic Thin-Film Solar Battery

The photoelectric conversion characteristic of an organic thin-film solar battery was measured in the same manner as that of example 1, except that the compound (M) was used in place of the compound (D). The results of measurements are shown in Table 1.

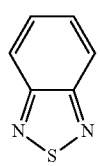

Example 11

Production and Evaluation of Organic Thin-Film Solar Battery

The photoelectric conversion characteristic of an organic thin-film solar battery was measured in the same manner as that of example 1, except that the compound (N) was used in place of the compound (D). The results of measurements are shown in Table 1.

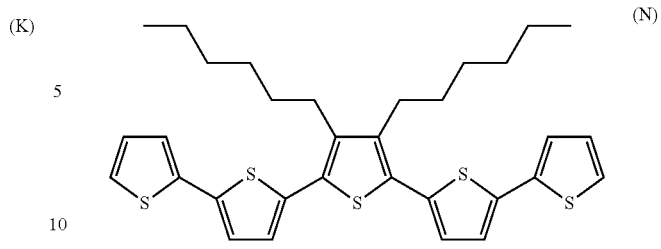

Comparative Example 1

Production and Evaluation of Organic Thin-Film Solar Battery

The photoelectric conversion characteristic of an organic thin-film solar battery was measured in the same manner as that of example 1, except that no sulfur-containing heterocyclic compound was used. The results of measurements are shown in Table 1.

TABLE 1

| | Sulfur-Containing Heterocyclic Compound | Voc (Open-Circuit Voltage) (V) | FF (Fill Factor) |
|---|---|---|---|
| Example 1 | Compound (D) | 0.89 | 0.62 |
| Example 2 | Compound (E) | 0.89 | 0.57 |
| Example 3 | Compound (F) | 0.89 | 0.57 |
| Example 4 | Compound (G) | 0.87 | 0.68 |
| Example 5 | Compound (H) | 0.87 | 0.67 |
| Example 6 | Compound (I) | 0.89 | 0.63 |
| Example 7 | Compound (J) | 0.89 | 0.54 |
| Example 8 | Compound (K) | 0.89 | 0.69 |
| Example 9 | Compound (L) | 0.90 | 0.68 |
| Example 10 | Compound (M) | 0.87 | 0.69 |
| Example 11 | Compound (N) | 0.88 | 0.58 |
| Comparative Example 1 | None | 0.85 | 0.60 |

Example 12

Production and Evaluation of Organic Thin-Film Solar Battery

Regioregular poly 3-hexylthiophene (P3HT, manufactured by Aldrich) serving as a conjugated polymer compound was dissolved in o-dichlorobenzene at a concentration of 1% (weight %). Thereafter, the compound (D) serving as a sulfur-containing heterocyclic compound with a weight equivalent to the weight of P3HT, and also C60PCBM (Phenyl C61-butyric acid methyl ester, manufactured by Frontier Carbon Corporation; trade name: E100) with a weight equivalent to the total weight of P3HT and the compound (D) as an electron acceptor were mixed with the solution. Next, the solution was filtered with a Teflon (registered trademark) filter of 1.0 μm to produce a coating solution.

A glass substrate on which an ITO film was deposited with a thickness of 150 nm by a sputtering method was subjected to a surface treatment with an ozone UV treatment. Next, the coating solution was applied by a spin coating method to obtain an active layer (film thickness: about 100 nm) for an organic thin-film solar battery. Thereafter, this was baked under conditions of 90° C. in vacuum for 60 minutes. Then, lithium fluoride was vapor-deposited thereon with a thickness of 4 nm, and Al was then vapor-deposited thereon with a thickness of 100 nm, by using a vacuum vapor depositing machine. Upon the vapor deposition, the degree of vacuum was 1 to 9×10$^{-3}$ Pa in all cases. The shape of the resulting organic thin-film solar battery had a square shape of 2 mm×2 mm. A Voc (open-circuit voltage) and an FF (fill factor, shape factor) of the resulting organic thin-film solar battery were measured by using a solar simulator (trade name: OTENTO-SUNII, manufactured by Bunkoukeiki Co., Ltd.: AM1.5G filter, irradiance 100 mW/cm$^2$). The results of measurements are shown in Table 2.

Comparative Example 2

Production and Evaluation of Organic Thin-Film Solar Battery

The photoelectric conversion characteristic of an organic thin-film solar battery was measured in the same manner as that of example 12, except that no sulfur-containing heterocyclic compound was used. The results of measurements are shown in Table 2.

TABLE 2

|  | Sulfur-Containing Heterocyclic Compound | Voc (Open-Circuit Voltage) (V) | FF (Fill Factor) |
|---|---|---|---|
| Example 12 | Compound (D) | 0.57 | 0.55 |
| Comparative Example 1 | None | 0.53 | 0.49 |

—Evaluation—

As clearly understood by Tables 1 and 2, the organic photoelectric conversion device having an organic layer containing a conjugated polymer compound and a sulfur-containing heterocyclic compound makes it possible to exhibit a high Voc value in comparison with that of an organic photoelectric conversion device having only the conjugated polymer compound.

INDUSTRIAL APPLICABILITY

Since the organic photoelectric conversion device of the present invention exhibits a high open-circuit voltage, the present invention is industrially extremely useful.

The invention claimed is:

1. An organic photoelectric conversion device comprising:
a pair of electrodes, at least one of which is transparent or semi-transparent; and
an organic layer arranged between the electrodes and containing a conjugated polymer compound and a sulfur-containing heterocyclic compound,
wherein the sulfur-containing heterocyclic compound has a condensed polycyclic structure or a bithiophene structure represented by a formula (1):

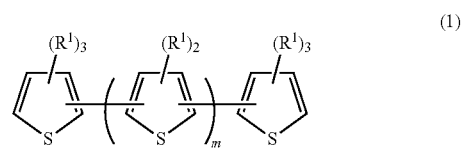

wherein, a plurality of R$^1$'s may be the same or different and each represents a hydrogen atom, a halogen atom, an alkyl group, an alkoxy group, an alkylthio group, an aryl group, an aryloxy group, an arylthio group, an arylalkyl group, an arylalkoxy group or an arylalkylthio group;
a hydrogen atom or atoms contained in these groups may be substituted by a fluorine atom or atoms; and in represents an integer of 0 to 10, and
the conjugated polymer compounds have one kind or two or more kinds of the following groups as a repeat unit, with the repeat units being mutually bonded to each other directly or through a linking group interposed therebetween: an unsubstituted or substituted fluorene-diyl group, an unsubstituted or substituted benzofluorene-diyl group, an unsubstituted or substituted dibenzofuran-diyl group, an unsubstituted or substituted dibenzothiophene-diyl group, an unsubstituted or substituted carbazole-diyl group, an unsubstituted or substituted thiophene-diyl group, an unsubstituted or substituted furan-diyl group, an unsubstituted or substituted pyrrole-diyl group, an unsubstituted or substituted benzothiadiazole-diyl group, an unsubstituted or substituted phenylenevinylene group, an unsubstituted or substituted thienylenevinylene group and an unsubstituted or substituted triphenylamine-diyl group, the linking group being selected from the group consisting of phenylene, biphenylene, naphthalene-diyl and anthracene-diyl.

2. The organic photoelectric conversion device according to claim 1, wherein the sulfur-containing heterocyclic compound in the organic layer has a weight in a range from 0.1 to 10000 parts by weight, relative to 100 parts by weight of the conjugated polymer compound.

3. The organic photoelectric conversion device according to claim 1, wherein the organic layer further contains an electron accepting compound.

4. The organic photoelectric conversion device according to claim 3, wherein the electron accepting compound is a fullerene derivative.

5. The organic photoelectric conversion device according to claim 1, wherein the organic layer further contains an electron donating compound.

* * * * *